(12) United States Patent
Haupt (10) Patent No.: US 11,942,450 B2
(45) Date of Patent: Mar. 26, 2024

(54) DEVICE AND METHOD OF FLUIDIC ASSEMBLY OF MICROCHIPS ON A SUBSTRATE

(71) Applicants: Commissariat à l'Énergie Atomique et aux Énergies Alternatives, Paris (FR); Centre National de la Recherche Scientifique, Paris (FR)

(72) Inventor: Melina Haupt, La Combe de Lancey (FR)

(73) Assignees: Commissariat à l'Énergie Atomique et aux Énergies Alternatives, Paris (FR); Centre National de la Recherche Scientifique, Paris (FR)

(*) Notice: Subject to any disclaimer, the term of this patent is extended or adjusted under 35 U.S.C. 154(b) by 197 days.

(21) Appl. No.: 17/529,365

(22) Filed: Nov. 18, 2021

(65) Prior Publication Data
US 2022/0165702 A1 May 26, 2022

(30) Foreign Application Priority Data

Nov. 20, 2020 (FR) ...................................... 2011965

(51) Int. Cl.
*H01L 23/00* (2006.01)
*H01L 25/075* (2006.01)

(52) U.S. Cl.
CPC .............. *H01L 24/75* (2013.01); *H01L 24/95* (2013.01); *H01L 25/075* (2013.01); *H01L 24/13* (2013.01);
(Continued)

(58) Field of Classification Search
CPC ....... H01L 24/75; H01L 25/075; H01L 24/13; H01L 24/14; H01L 2224/13011; H01L 2224/13014; H01L 2224/13016; H01L 2224/1415; H01L 2224/75655; H01L 2224/7598
(Continued)

(56) References Cited

U.S. PATENT DOCUMENTS

2006/0269689 A1* 11/2006 Craig .................. H05K 13/027
257/E21.705
2017/0372927 A1  12/2017 Schuele et al.
(Continued)

FOREIGN PATENT DOCUMENTS

EP          2 523 214 A1    11/2012

OTHER PUBLICATIONS

Preliminary Search Report for French Application No. 2011965, dated Aug. 12, 2021.

*Primary Examiner* — Nduka E Ojeh
*Assistant Examiner* — Laura M Dykes
(74) *Attorney, Agent, or Firm* — Wolf, Greenfield & Sacks, P.C.

(57) ABSTRACT

A cell of fluidic assembly of microchips on a substrate, including: a base having its upper surface intended to receive the substrate; a body laterally delimiting a fluidic chamber above the substrate; and a cover closing the fluidic chamber from its upper surface, wherein the body comprises first and second nozzles respectively emerging onto opposite first and second lateral edges of the fluidic chamber, each of the first and second nozzles being adapted to injecting and/or sucking in a liquid suspension of microchips into and/or from the fluidic chamber, in a direction parallel to the mean plane of the substrate.

18 Claims, 7 Drawing Sheets

(52) U.S. Cl.
CPC .............. *H01L 24/14* (2013.01); *H01L 24/81* (2013.01); *H01L 2224/13011* (2013.01); *H01L 2224/13014* (2013.01); *H01L 2224/13016* (2013.01); *H01L 2224/1415* (2013.01); *H01L 2224/75655* (2013.01); *H01L 2224/7598* (2013.01); *H01L 2224/81085* (2013.01); *H01L 2224/95085* (2013.01); *H01L 2224/95101* (2013.01)

(58) Field of Classification Search
USPC .......................................................... 438/23
See application file for complete search history.

(56) References Cited

U.S. PATENT DOCUMENTS

| | | | |
|---|---|---|---|
| 2018/0029038 A1* | 2/2018 | Sasaki | .................... G09G 3/006 |
| 2019/0172968 A1 | 6/2019 | Yuen | |
| 2019/0232661 A1* | 8/2019 | Akai | ..................... B01F 31/651 |

* cited by examiner

DEVICE AND METHOD OF FLUIDIC ASSEMBLY OF MICROCHIPS ON A SUBSTRATE

CROSS REFERENCE TO RELATED APPLICATIONS

This application claims priority to French application number 2011965, filed Nov. 20, 2020. The contents of which is incorporated by reference in its entirety.

TECHNICAL BACKGROUND

The present disclosure generally concerns the field of the assembly of microchips on a substrate, for example, for the forming of an emissive image display device comprising light-emitting diodes (LED), for example, a screen of a television, of a computer, of a smartphone, of a digital tablet, etc.

PRIOR ART

A method of manufacturing an image display device comprising a plurality of elementary electronic microchips arranged in an array on a same transfer substrate has already been provided in patent application EP3381060. According to this method, the microchips and the transfer substrate are manufactured separately. Each microchip comprises a stack of a LED and of a circuit for controlling the LED. The control circuit comprises a connection surface opposite to the LED, comprising electric connection areas intended to be connected to the transfer substrate for the control of the microchip. The transfer substrate comprises a connection surface comprising, for each microchip, electric connection areas intended to be respectively connected to the electric connection areas of the microchip. The chips are then placed on the transfer substrate, with their connection surfaces facing the connection surface of the transfer substrate, and attached to the transfer substrate to connect the electric connection areas of each microchip to the corresponding electric connection areas of the transfer substrate.

Due to the relative small dimensions of microchips, their assembly on the transfer substrate is difficult to perform.

Patent U.S. Pat. No. 10,243,097 describes a method of fluidic assembly of microchips, for examples, LEDs, on a substrate. The substrate is placed at the bottom of a fluidic chamber and has, on its upper surface side, microcavities intended to each receive a microchip. A liquid suspension containing the microchips is injected into the fluidic chamber, and a back and forth motion is applied to the suspension by a fluidic oscillator, to deposit the microchips at the bottom of the substrate cavities.

It would be desirable to at least partly improve certain aspects of known solutions of fluidic assembly of microchips on a substrate.

SUMMARY

For this purpose, an embodiment provides a cell of fluidic assembly of microchips on a substrate, comprising:
  a base having its upper surface intended to receive the substrate;
  a body laterally delimiting a fluidic chamber above the substrate; and
  a cover closing the fluidic chamber from its upper surface, wherein the body comprises first and second nozzles respectively emerging onto opposite first and second lateral edges of the fluidic chamber, each of the first and second nozzles being adapted to injecting and/or sucking in a liquid suspension of microchips into and/or from the fluidic chamber, in a direction parallel to the mean plane of the substrate.

According to an embodiment, the first nozzle has a first end emerging onto the first lateral edge of the fluidic chamber and a second end intended to be connected to a device for circulating the liquid suspension, and the second nozzle has a first end emerging onto the second lateral edge of the fluidic chamber and a second end intended to be connected to the device for circulating the liquid suspension.

According to an embodiment, the first end of the first nozzle and the first end of the second nozzle each have a width substantially equal to the width of the fluidic chamber.

According to an embodiment, each of the first and second nozzles progressively widens in the direction of the width of the fluidic chamber between its second and its first end.

According to an embodiment, each of the first and second nozzles progressively thins in a direction orthogonal to the base between its second and its first end.

Another embodiment provides a device of fluidic assembly of microchips on a substrate, comprising:
  a fluidic assembly cell such as defined hereabove; and
  a device for circulating a liquid suspension of microchips in the fluidic chamber, coupled to the second end of the first nozzle and to the second end of the second nozzle.

According to an embodiment, the circulating device comprises a first reservoir coupled to the second end of the first nozzle, and a second reservoir coupled to the second end of the second nozzle, each of the first and second reservoirs being equipped with a motor-driven plunger, enabling to apply a back and forth motion to the suspension within the fluidic chamber.

According to an embodiment, the circulating device comprises a circular flow pump having an outlet coupled to the second end of the first nozzle, and an inlet coupled to the second end of the second nozzle.

According to an embodiment, the assembly device comprises a plurality of fluidic assembly cells such as defined hereabove, series-connected via their first and second respective nozzles.

Another embodiment provides a method comprising the use of a device such as defined hereabove, to assemble microchips on a substrate.

According to an embodiment, the substrate comprises, on its upper surface side, a plurality of cavities intended to each accommodate one microchip.

According to an embodiment, the substrate is an intermediate transfer substrate made of a polymer material, preferably made of PDMS.

According to an embodiment, each microchip comprises a LED.

According to an embodiment, each microchip further comprises a circuit for controlling the LED arranged against a surface of the LED.

According to an embodiment, each microchip comprises one or a plurality of metal microtubes protruding from a connection surface of the microchip.

According to an embodiment, the liquid of the suspension is a saline solution, preferably a sodium polytungstate solution.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various applications capable of taking advantage of the described fluidic assembly solutions have not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
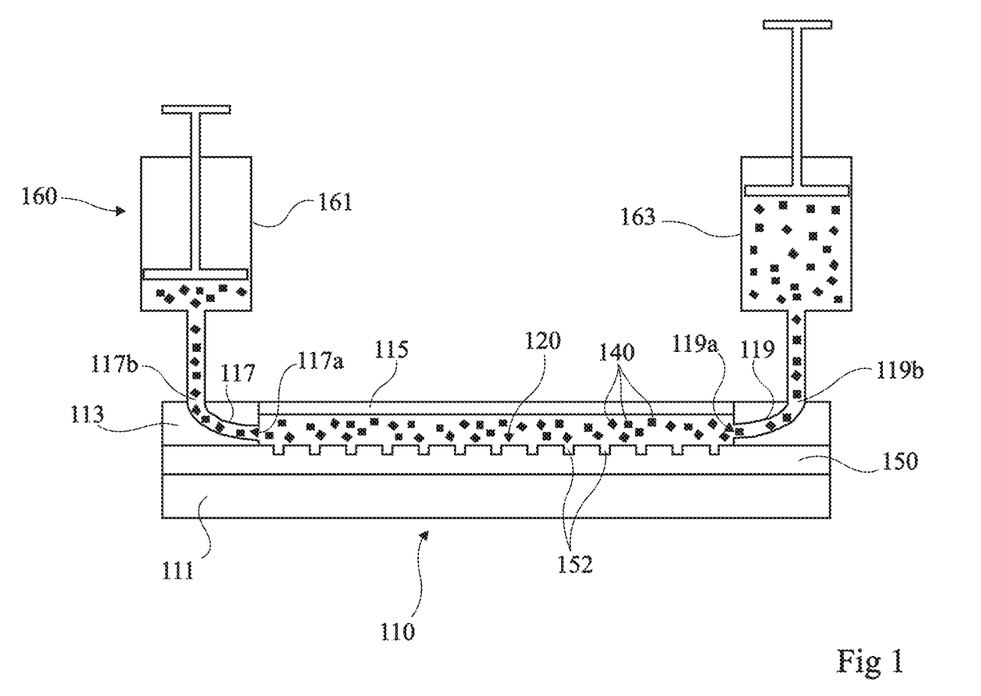
FIG. 1 is a cross-section view schematically showing an example of a device of fluidic assembly of microchips on a substrate according to an embodiment.

FIG. 1 is a cross-section view schematically showing an example of a device of fluidic assembly of microchips 140 on a substrate 150 according to an embodiment.

In this example, substrate 150 comprises, on its upper surface side, a plurality of cavities 152 intended to each receive a single microchip 140. As an example, microchips 140 are all identical to within manufacturing dispersions, and cavities 152 all have the same dimensions to within manufacturing dispersions. Each microchip for example has lateral dimensions in the range from 10 to 100 µm. Each cavity 152 may have lateral dimensions slightly greater, for example, greater by from 1 to 20 percents, than the lateral dimensions of microchips 140. The depth of cavities 152 is for example substantially equal to the thickness of microchips 140, for example, in the range from 5 to 20 µm. In top view, cavities 152 and microchips 140 may have a circular shape, which enables to ease the assembly. The described embodiments are however not limited to this specific case. As an example, microchips 140 may have any other shape, with or without symmetry. In top view, cavities 152 are for example arranged in an array along rows and columns.

Substrate 150 may be an intermediate support substrate, for example, made of a polymer material, for example, of polydimethylsiloxane (PDMS). Cavities 152 may then be formed by molding, for example, on a silicon mold. In this case, after the filling of cavities 152 with microchips 140, microchips 140 are collectively transferred onto a transfer substrate or a destination substrate (not shown), for example, an interconnect matrix, using substrate 150 as a transfer support. The transfer substrate may comprise electric connection areas. At the end of the transfer, microchips 140 may be bonded to the transfer substrate to connect electric connection areas (not shown in FIG. 1) of each microchip to corresponding electric connection areas of the transfer substrate.

As a variant, support substrate 150 may correspond to the final transfer substrate of the device which is desired to be formed. In this case, the intermediate transfer step may be omitted. After the filling of cavities 152 with microchips 140, microchips 140 may then be attached to substrate 150 to connect electric connection areas of each microchip to corresponding electric connection areas (not shown) of substrate 150.

As an example, microchips 140 may be elementary pixels of a display screen. Each microchip 140 may for example only comprise one LED, or a LED and a circuit for controlling the LED, or a plurality of LEDs and a circuit for controlling said plurality of LEDs. As an example, each microchip comprises a stack of a LED and of a circuit for controlling the LED, as described in the above-mentioned patent application EP3381060.

The device of FIG. 1 comprises a fluidic assembly cell 110 comprising a base 111 having an upper surface intended to receive substrate 150. Base 111 for example has the shape of a plate, for example, a generally square or rectangular shape (in top view). In this example, substrate 150 is in contact, by its lower surface, with the upper surface of base 111.

Cell 110 further comprises a body 113 laterally delimiting a fluidic chamber 120 above substrate 150. Body 113 comprises a frame, for example, of generally square or rectangular shape, defining lateral walls of fluidic chamber 120. In this example, body 113 is arranged on top of and in contact with the upper surface of substrate 150. The upper surface of substrate 150 defines the bottom of fluidic chamber 120.

Cell 110 further comprises a cover 115 arranged on the upper surface side of body 113. Cover 115 for example has the shape of a plate, for example, a generally square or rectangular shape (in top view). The lower surface of cover 115 defines the upper surface of fluidic chamber 120.

In this example, the body 113 of assembly cell 110 further comprises two nozzles 117 and 119 respectively arranged opposite two opposite lateral edges of fluidic chamber 120. Each of nozzles 117 and 119 is adapted to injecting and/or sucking in a liquid into and from fluidic chamber 120, in a direction parallel to the mean plane of substrate 150 (for example, parallel to the upper surface of base 111). Each of nozzles 117 and 119 is essentially formed by an injection/suction duct integrated in a lateral wall of body 113. Nozzle 117 has a first end 117a emerging into fluidic chamber 120 above the upper surface of substrate 150, and a second end 117b opposite to end 117a, intended to be coupled to a device 160 for circulating a liquid. Similarly, nozzle 119 has a first end 119a emerging into fluidic chamber 120 above the upper surface of substrate 150, and a second end 119b opposite to end 119a, intended to be coupled to device 160 for circulating a liquid. At the level of their ends 117a and 119a, the longitudinal axes of nozzles 117 and 119 are oriented along a direction substantially parallel, for example, parallel to within 20°, to the mean plane of substrate 150. In the shown example, at the level of their ends 117b and 119b, the nozzles are oriented along a direction substantially perpendicular to the mean plane of substrate 150. Thus, each of nozzles 117 and 119 forms an elbow inside of the lateral wall of the body 113 where it is integrated. The described embodiments are however not limited to this specific case.

In the example of FIG. 1, device 160 for circulating a liquid comprises two reservoirs 161 and 163, each provided with a motor-driven plunger. Reservoir 161 is connected to the end 117b of nozzle 117, and reservoir 163 is connected to the end 119b of nozzle 119.

Reservoirs 161 and 163 are connected to each other via the nozzles 117 and 119 of fluidic chamber 120.

Reservoir 161 is filled with a liquid suspension containing microchips 140. The number of microchips 140 contained in the reservoir is in practice greater, or even much greater, than the number of cavities 152 of substrate 150.

To fill the cavities 152 of substrate 150 with microchips 140, the liquid suspension is injected into the fluidic chamber via nozzle 117 by pumping by means of the motor-driven plunger of reservoir 161, and then a back-and-forth motion is applied to the suspension inside of fluidic chamber 120, parallel to the upper surface of substrate 150, by pumping by means of the motor-driven plungers of reservoirs 161 and 163.

More particularly, in this example, the liquid suspension is first sucked in by nozzle 119 into reservoir 163, and then injected again into fluidic chamber 120 from reservoir 163 and sucked in by nozzle 117 into reservoir 161, and so on.

During the successive back and forth motions of the suspension in fluidic chamber 120, microchips 140 deposit and then remain trapped in cavities 152 of the substrate. The force of the flow may be adapted according to the microchip settling speed, to both obtain a sufficient settling to fill cavities 152, and at the same time avoid too significant a settling which would result in an uncontrolled deposition.

The liquid of the suspension is for example pure demineralized water, or water with added surfactants, for example, Triton X-100, polyoxyethylene sorbitan monooleate or sodium dodecylbenzenesulfonate (SDBS), to guarantee a better wettability of the surfaces and decrease the surface tension and the shearing force in the solution.

As a variant, the liquid of the suspension may comprise organic solvents such as ethanol, ethyl acetate, isopropanol, ethylene glycol, glycerol, propylene glycol, di/tri/tetra-ethylene glycol, or a mixture of one or a plurality of these solvents.

The liquid of the suspension may be a saline solution to increase the volumetric density and improve the floatability of the microparticles. For example, a solution of sodium polytungstate ($3Na_2WO_4.9WO_3.H_2O$) having a volumetric density in water that can be varied, for example, from 1.1 to 3.1 $g/cm^3$, which enables to adjust the properties of the solvent to the weight and to the settling speed of the microparticles. The solution of sodium polytungstate in $H_2O$ further has the advantage of being transparent and non-toxic.

As a variant, other salts such as cesium chloride having a volumetric mass which is also variable may be used.

As a variant, the liquid of the suspension may comprise heavy water ($D_2O$ or $^2H_2O$) as a solvent, to vary the polarity and thus the hydrophilic properties of the surfaces.

Whatever the suspension liquid used, it is preferably to degas the solution by depressurizing before the injection into assembly cell 110. This particularly enables to avoid the presence of air bubbles in the fluidic chamber.

An optical vision system (not shown) may be provided to monitor the filling of cavities 152 with microchips 140. The optical vision system may comprise an image sensor placed above cover 115, cover 115 then being transparent or translucent. As a variant, the optical vision system may comprise an image sensor placed under base 111, base 111 then being transparent or translucent. The optical vision system may for example comprise an optical microscope placed above cover 115, or a lens-free imaging system placed under base 111.

The process may be interrupted when the rate of filling of the cavities with the microchips reaches a sufficient level, for example, when all the cavities 152 contain a microchip 140. The liquid suspension remaining in the fluidic chamber is then removed, and assembly cell 110 is dismounted to sample substrate 150. An intermediate step of substrate rinsing, for example, with a pure solvent, for example, demineralized water, may be provided. Substrate 150 may then be applied as a buffer, against a connection surface of a transfer substrate, to attach the microchips on the transfer substrate and electrically connect connection areas of the microchips to corresponding connection areas of the transfer substrate. Substrate 150 can then be removed, leaving microchips 140 in place on the transfer substrate.

An advantage of the fluidic assembly cell described in relation with FIG. 1 is linked to the orientation substantially parallel to substrate 150 of the inlet-outlet openings 117a and 119a of nozzles 117 and 119. This enables to obtain a quasi laminar flow of the liquid suspension above substrate 150, along the entire length of the fluidic chamber. This results in a very regular and repeatable deposition of microchips 140 into the cavities 152 of the substrate. This particularly is an advantage over the solution described in the above-mentioned patent U.S. Pat. No. 10,243,097, where the suspension is injected perpendicularly to the microchip accommodation substrate, which causes turbulence in the liquid suspension flow and increases the time necessary to fill all the cavities of the substrate.

Optionally, the upper surface of substrate 150 may be treated to exhibit hydrophilic areas and hydrophobic areas. In the case of a PDMS substrate, this may be obtained by a local treatment by means of an oxygen-based plasma, or an ultraviolet-ozone treatment, enabling to make the naturally hydrophobic surface of the PDMS hydrophilic. A photolithography mask may be used to selectively expose the surface of the PDMS only opposite cavities 152. Thus, a surface which is hydrophilic at the level of cavities 152 and hydrophobic on the rest of the substrate, is obtained. This enables to ease the deposition of the microchips into the cavities, and to discharge the remaining suspension at the end of the filling of the cavities with the microchips.

Figure 2:
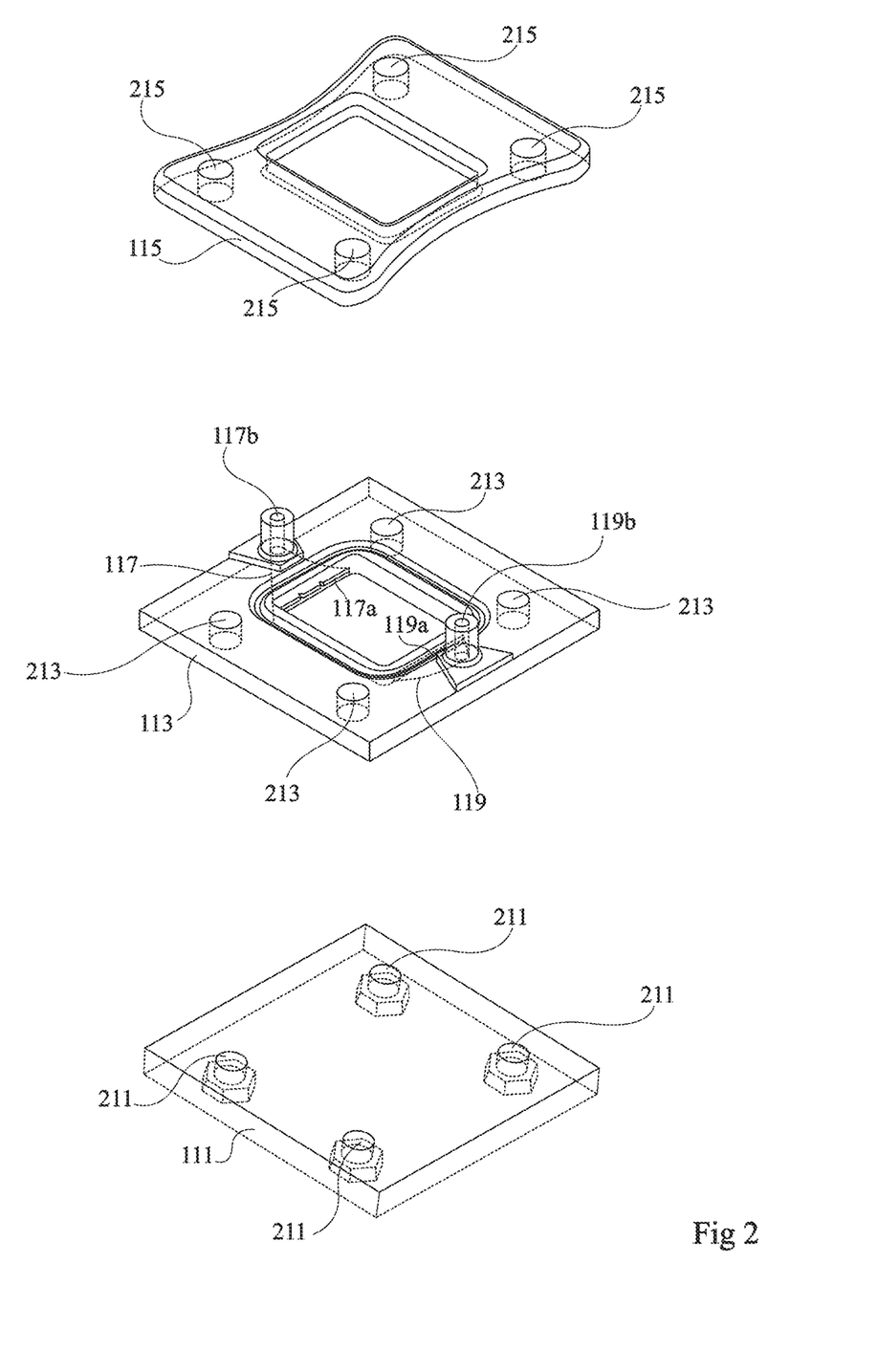
FIG. 2 is an exploded perspective view illustrating in further detail an embodiment of a fluidic assembly cell of the device of FIG. 1.

FIG. 2 is an exploded perspective view illustrating in further detail an embodiment of the fluidic assembly cell 110 of the device of FIG. 1. In FIG. 2, substrate 150 has not been shown. In the example of FIG. 2, base 111, body 113, and cover 115 each comprise through holes 211, respectively 213, respectively 215 intended to receive clamping bolts.

More generally, any other adapted attachment means may be used, for example, a fast clamping device or a robotized mechanical attachment.

In a preferred embodiment, as illustrated in FIG. 2, openings 117a and 119a of the inlet-outlet nozzles of the liquid suspension in fluidic chamber 120 each extend across substantially the entire width of the fluidic chamber. Here again, this enables to favor a quasi laminar flow of the liquid suspension above substrate 150, along the entire length of the fluidic chamber.

It should be noted that width of the fluidic chamber 120 here means the dimension of the lateral edges of fluidic chamber 120 comprising the openings 117a and 119a of nozzles 117 and 119 and length of the fluidic chamber means the dimension of the lateral edges of the fluidic chamber orthogonal to the edges comprising the openings 117a and 119a of nozzles 117 and 119.

Figure 3:
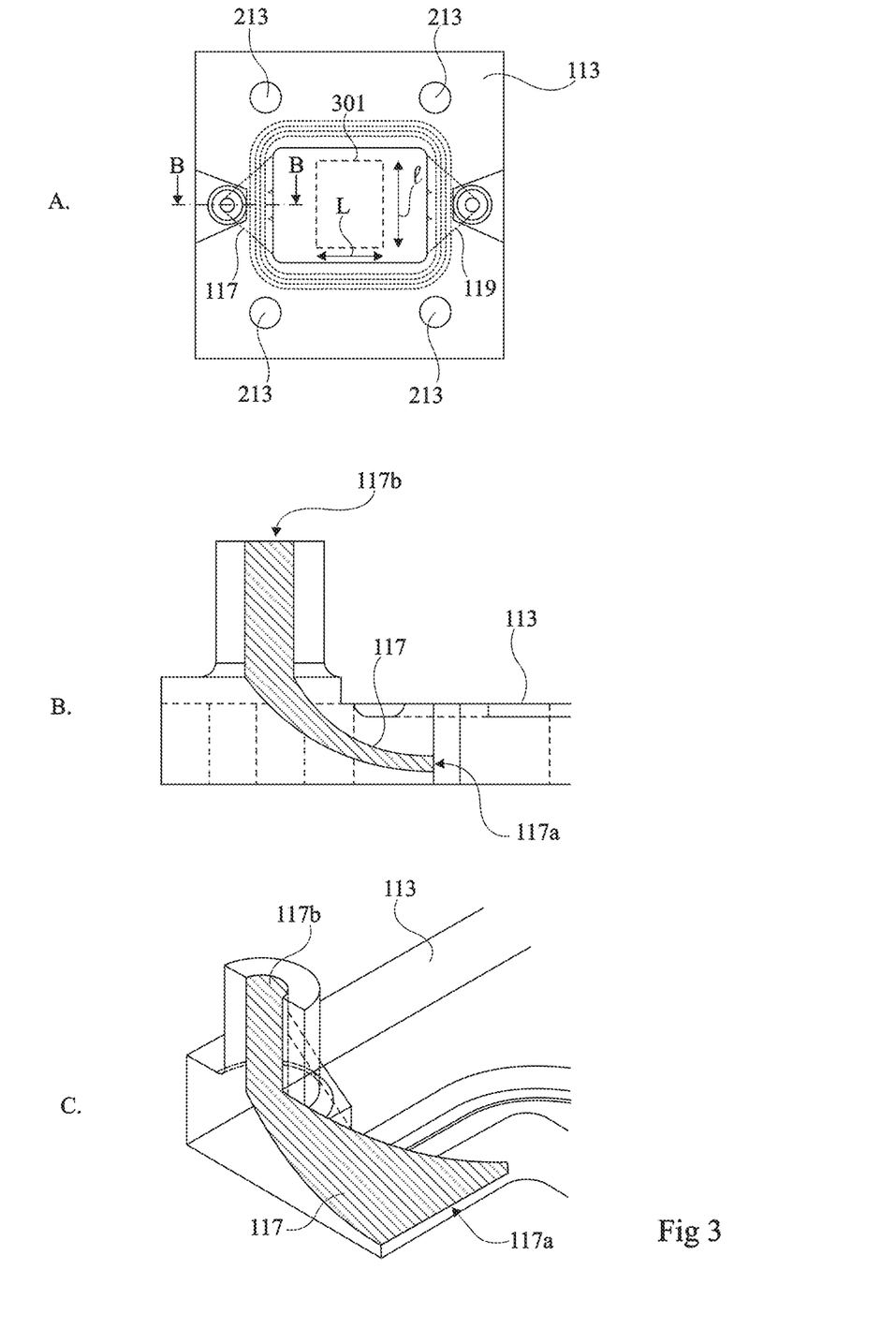
FIG. 3 shows in further detail an example of embodiment of a body element of the fluidic assembly cell of FIG. 2.

FIG. 3 shows in further detail an embodiment of the body element 113 of the fluidic assembly cell 110 of FIG. 2. FIG. 3 more particularly comprises a top view A of element 113, a partial side cross-section view B of element 113 along plane B-B of view A, and a partial perspective cutout view C of element 113 along plane B-B of view A. In cross-section views B and C, the surface area occupied by nozzle 117 has been hatched for more visibility.

As shown in FIG. 3, nozzle 117 has the shape of a curved duct. On the side of its end 117b, nozzle 117 has, in this example, the shape of a vertical cylindrical duct. Closer to end 117a, the transverse cross-section of nozzle 117 thins (in terms of thickness) and flares (widthwise) to reach a width substantially equal to the width of the fluidic chamber.

Nozzle 119 (not shown in views B and C of FIG. 3) has substantially the same shape as nozzle 117.

In view A of FIG. 3, an area 301 corresponding to the surface area occupied by the useful portion of substrate 150, also called transfer buffer, that is, the portion of substrate 150 which will be effectively used to transfer microchips 140 onto a transfer substrate, has been shown in dashed lines. Preferably, the width of fluidic chamber 120 is greater, for example from 1.2 to 2 times greater, than the width 1 of the transfer buffer. Further, the length of fluidic chamber 120 (distance between ends 117a and 119a of nozzles 117 and 119) is preferably greater, for example, from 1.5 to 3 times greater, than the length L of the transfer buffer. This enables to ensure a great homogeneity of the flow above the transfer buffer while avoiding peripheral turbulence. As a non-limiting example, fluidic chamber 120 has a width in the order of 15 mm, a length in the order of 20 mm, a height (thickness) in the order of 3 mm, and the transfer buffer is adapted to accommodating an array of 40×40 microchips 140 with a pitch (center-to-center distance between two neighboring microchips) in the order of 210 μm.

To form a display screen of large dimensions, several possibilities may be envisaged.

A first possibility is to successively transfer groups of microchips onto a transfer substrate of large dimensions by means of transfer buffers of smaller dimensions formed by fluidic assembly as described hereabove.

A second possibility is to increase the dimensions of fluidic assembly cell 110 and of support substrate 150 to have them correspond to the size of the screen to be formed.

Figure 4:
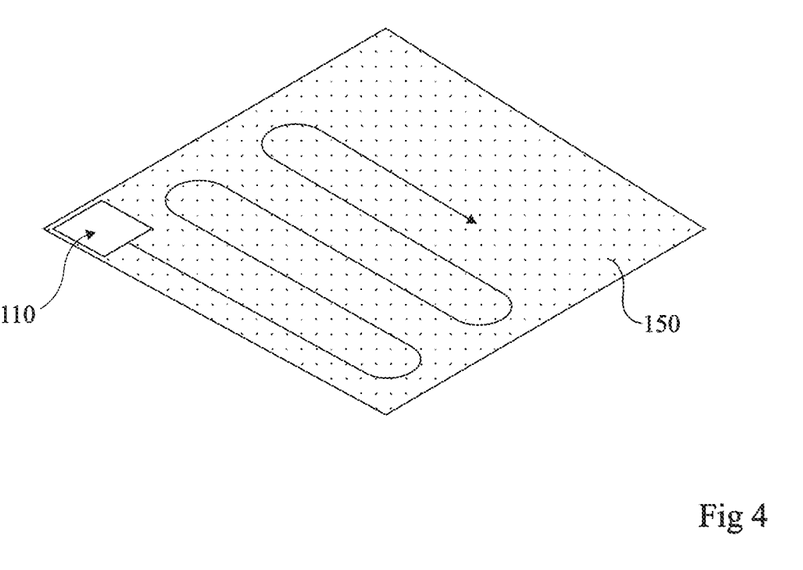
FIG. 4 very schematically illustrates an example of a method of fluidic assembly of microchips on a substrate.

A third possibility is to have the fluidic assembly cell slide along a support substrate 150 of large dimensions (that is, greater than the dimensions of the fluidic chamber), to successively fill the cavities 152 of distinct regions of substrate 150. During the displacement of fluidic assembly cell 110 along the surface of substrate 150, base 111 slides under the lower surface of substrate 150 and the body and the cover slide on the upper surface of substrate 150. The displacement of fluidic assembly cell 110 may be performed continuously, or in discretized fashion (area by area) with or without discharge of the suspension between two displacements.

FIG. 4 very schematically illustrates this third possibility.

Figure 5:
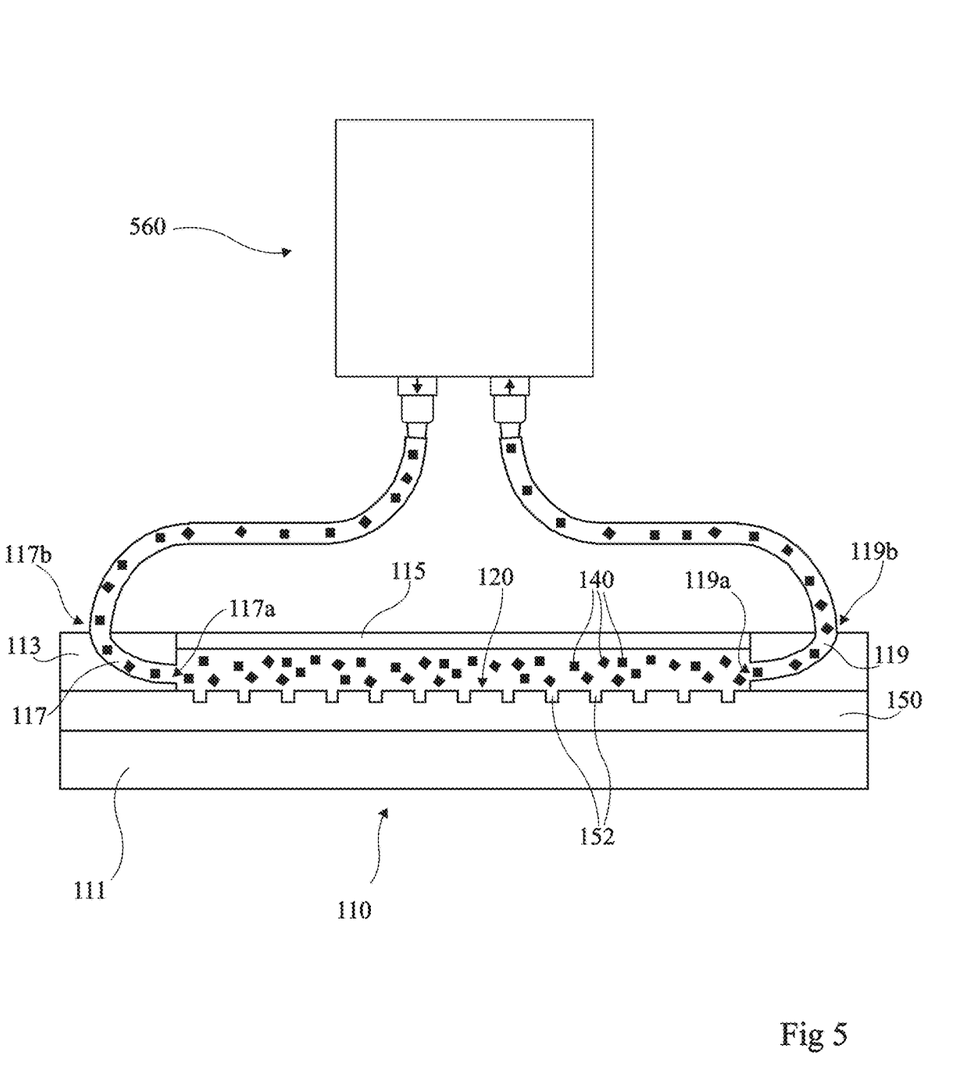
FIG. 5 is a cross-section view schematically showing an alternative embodiment of the fluidic assembly device of FIG. 1.

FIG. 5 is a cross-section schematically showing an alternative embodiment of the fluidic assembly device of FIG. 1. In this example, the circulating device 160 of the assembly device of FIG. 1 is replaced with a circulating device 560. Device 560 is adapted to causing a circular motion of the suspension. Device 560 for example comprises a circular flow pump, for example, a peristaltic pump, having an input connected to the output 119b of nozzle 119 and an output connected to the input 117b of nozzle 117. Device 560 may be provided with a reservoir, not shown, enabling to discharge or to replace the suspension.

Thus, in this example, the liquid suspension comprising microchips 140 always flows in the same direction inside of fluidic chamber 120.

As a variant, not shown, a plurality of fluidic assembly cells 110 of the type described hereabove may be connected in series via their respective nozzles 117 and 119 and share a same device 560 for circulating the liquid suspension. In this case, device 560 has an output connected to the input 117b of nozzle 117 of the first cell of the series association, and an input connected to the output 119b of nozzle 119 of the last cell 110 of the series association.

Similarly, in the example of FIG. 1, a plurality of fluidic assembly cells 110 may be series-connected via their respective nozzles 117 and 119 between reservoir 161 and reservoir 163 of circulating device 160.

It should be noted that in the case where support substrate 150 is an intermediate transfer substrate, it is preferable for microchips 140 to be oriented with their connection surfaces facing upwards, that is, toward the outside of cavities 152.

Preferably, to ensure the proper orientation of microchips 140 in cavities 152, each microchip 140 is provided with electrically-conductive microstructures protruding from its connection surface, electrically connected to the electric connection area of the microchip. As an example, the conductive microstructures are metal microtubes, for example, made of tungsten, formed by a method of the type described in patent application US2011/094789.

Figure 6:
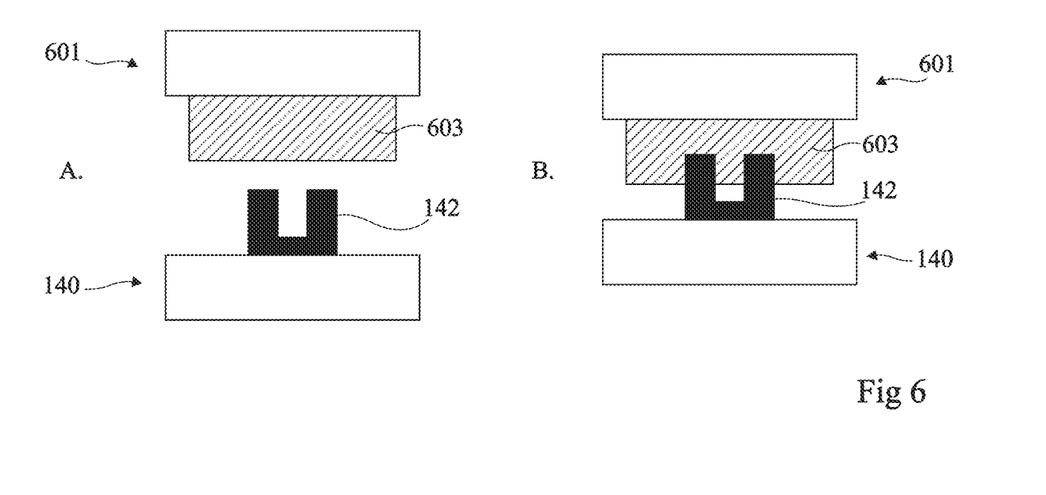
FIG. 6 schematically shows an example of a method of attachment and of electric connection of a microchip to a transfer substrate.

FIG. 6 schematically illustrates a method of assembly of a microchip 140 on a transfer substrate 601. FIG. 6 comprises a view A showing microchip 140 and transfer substrate 601 before assembly, and a view B showing microchip 140 and transfer substrate 601 after assembly.

Microchip 140 comprises, on its connection surface side (upper surface in the orientation of FIG. 1), a metal microtube 142, electrically connected to an electric connection area (not detailed in the drawing) of the microchip.

Transfer substrate 601 comprises, on its connection surface side (lower surface in the orientation of FIG. 1), an electric connection area 603 intended to be connected to the connection area of the microchip. The electric connection area 603 of transfer substrate 601 is made of a metal softer than the metal of microtube 142. During the assembly, microchip 140 is pressed against transfer substrate 601, with its connection surface facing the connection surface of the transfer substrate. Microtube 142 then penetrates into the metal of the electric connection area 603 of the transfer substrate, forming both the electric connection and the mechanical attachment between the microchip and the transfer substrate.

In the case of a fluidic assembly of the above-described type, microtubes 142 have the advantage of guaranteeing the proper orientation of the microchips in the cavities 152 of the substrate. Indeed, when a microchip 140 positions upside down in a cavity 152, that is, with its connection surface facing the bottom of the cavity, the microtubes 142 present on the connection surface of the microchip prevent the microchip from being pressed against the bottom of the cavity. The microchip is then driven along by the liquid flow, and comes out of the cavity. Only the microchips 140 oriented in the right direction, that is, with their connection surface facing the outside of the cavity, remain trapped in cavities 152.

Figure 7:
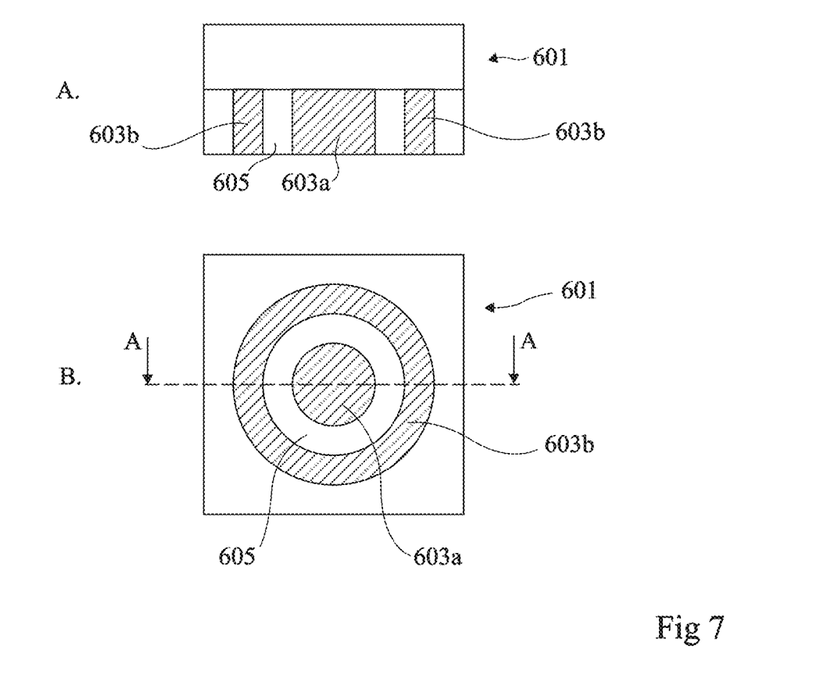
FIG. 7 schematically shows an example of electric connection areas of a transfer substrate.

FIG. 7 schematically shows an example of layout of electronic connection areas of transfer substrate 601. FIG. 7 more particularly shows a portion of transfer substrate 601 intended to receive a microchip 140. In practice, the portion shown in FIG. 7 may be repeated identically a large number of times, for example, in an array layout, to accommodate the different microchips of the final device. FIG. 7 more specifically comprises a bottom view B of the substrate and a cross-section view A along plane A-A of view B.

In this example, each microchip 140 (not shown in FIG. 7) comprises, on its connection surface, two electric connection areas, for example, metallic, electrically insulated from each other. Each microchip 140 is for example a LED, the two electric connection areas respectively corresponding to an anode electrode and to a cathode electrode of the LED. For each microchip 140, transfer substrate 601 comprises, on its connection surface, two corresponding electric connection areas 603a and 603b, for example, metallic, electrically insulated from each other. Electric connection areas 603a and 603b are separated from each other by an electrically-insulating material 605. In the shown example, electric connection areas 603a and 603b are flush with the level of the upper surface of insulator 605.

In this example, in top view, electric connection areas 603a and 603b are concentric. More particularly, in top view, area 603a has the shape of a circle, and area 603b has the shape of a circular ring surrounding area 603a.

Figure 8:
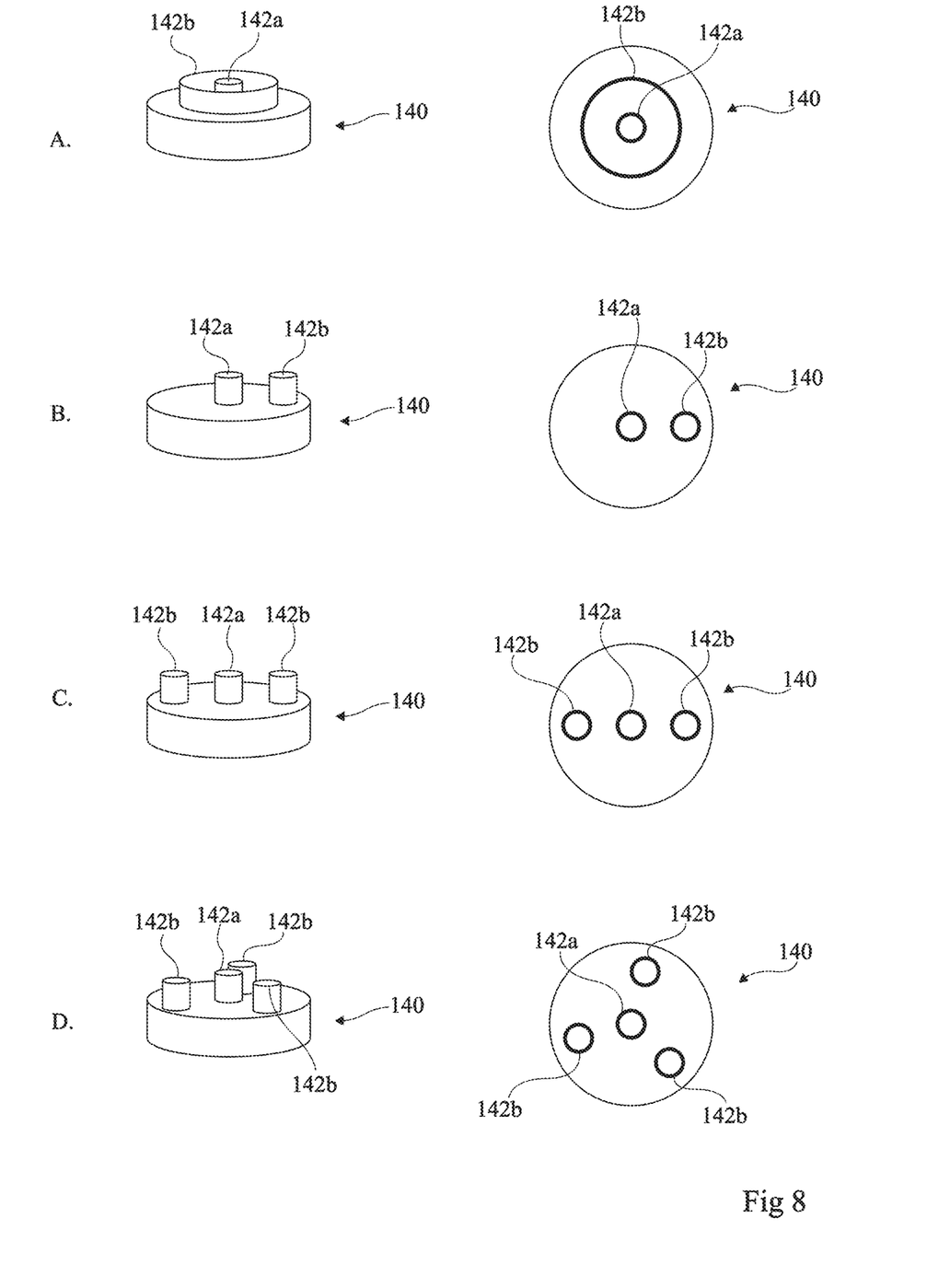
FIG. 8 schematically shows examples of arrangement of elements of electric connection of a microchip.

FIG. 8 schematically shows examples of layout of the electric connection microtubes of a microchip 140 intended to be transferred onto the transfer substrate 601 of FIG. 7.

FIG. 8 comprises four views A, B, C, and D respectively corresponding to four examples of layout of the connection microtubes 142 of a microchip 140 intended to be transferred onto the transfer substrate 601 of FIG. 7. Each of views A, B, C, and D shows, in its left-hand portion, a perspective view of the microchip and, in its right-hand portion, a view of the connection surface of the microchip.

In each of the four shown examples, microchip 140 comprises a central microtube 142a, intended to be connected to the central electric connection area 603a of transfer substrate 601, and one or a plurality of peripheral microtubes 142b intended to be connected to the peripheral electric connection area 603b of transfer substrate 601.

In the example of the view A of FIG. 8, microchip 140 comprises a single microtube 142b having a greater diameter than microtube 142a, microtubes 142a and 142b being concentric.

In the example of the view B of FIG. 8, microchip 140 comprises a single microtube 142b having a diameter substantially equal to that of microtube 142a, arranged in a peripheral region of the microchip.

In the example of the view C of FIG. 8, microchip 140 comprises two microtubes 142b having a diameter substantially equal to that of microtube 142a, arranged in a peripheral region of the microchip and diametrically opposite with respect to the center of the microchip.

In the example of the view D of FIG. 8, microchip 140 comprises three microtubes 142b having a diameter substantially equal to that of microtube 142a, arranged in a peripheral region of the microchip and regularly distributed along a circle around microtube 142a.

Various embodiments and variants have been described. Those skilled in the art will understand that certain features of these various embodiments and variants may be combined, and other variants will occur to those skilled in the art. In particular, the described embodiments are not limited to the forming of a display screen where microchips 140 each correspond to a pixel of the screen, but more generally apply to the forming of any device requiring the transfer of a large number of microchips onto a same substrate.

Further, the described embodiments are not limited to the examples described hereabove where each microchip 140 comprises two metal areas of connection to its connection surface, but may apply to microchips comprising a number of connection metal areas different from two.

Further, the described embodiments are for example not limited to the examples of dimensions and of materials mentioned in the description.

The invention claimed is:

1. Cell of fluidic assembly of microchips on a substrate, comprising:
   a base having its upper surface intended to receive the substrate;
   a body laterally delimiting a fluidic chamber above the substrate; and
   a cover closing the fluidic chamber from its upper surface, wherein the body comprises first and second nozzles respectively emerging onto opposite first and second lateral edges of the fluidic chamber, each of the first and second nozzles being adapted to injecting and/or sucking in a liquid suspension of microchips into and/or from the fluidic chamber, in a direction parallel to the mean plane of the substrate.

2. Cell according to claim 1, wherein the first nozzle has a first end emerging onto the first lateral edge of the fluidic chamber and a second end intended to be connected to a device for circulating the liquid suspension, and wherein the second nozzle has a first end emerging onto the second lateral edge of the fluidic chamber and a second end intended to be connected to the device for circulating the liquid suspension.

3. Cell according to claim 2, wherein the first end of the first nozzle and the first end of the second nozzle each have a width substantially equal to the width of the fluidic chamber.

4. Cell according to claim 2, wherein each of the first and second nozzles progressively widens in the width direction of the fluidic chamber between its second and its first end.

5. Cell according to claim 2, wherein each of the first and second nozzles progressively thins in a direction orthogonal to the base between its second and its first end.

6. Device of fluidic assembly of microchips on a substrate, comprising:
   at least one cell of fluidic assembly according to claim 2; and
   a device for circulating a liquid suspension of microchips in the fluidic chamber, coupled to the second end of the first nozzle and to the second end of the second nozzle.

7. Assembly device according to claim 6, wherein the circulating device comprises a first reservoir coupled to the second end of the first nozzle, and a second reservoir coupled to the second end of the second nozzle, each of the first and second reservoirs being equipped with a motor-driven plunger, enabling to apply a back and forth motion to the suspension within the fluidic chamber.

8. Assembly device according to claim 6, wherein the circulating device comprises a circular flow pump having an outlet coupled to the second end of the first nozzle, and an inlet coupled to the second end of the second nozzle.

9. Assembly device according to claim 6, comprising a plurality of fluidic assembly cells series-connected via their first and second respective nozzles.

10. Method comprising the use of a device according to claim 6, to assemble microchips on a substrate.

11. Method according to claim 10, wherein the substrate comprises, on its upper surface side, a plurality of cavities intended to each receive one microchip.

12. Method according to claim 10, wherein the substrate is an intermediate transfer substrate made of a polymer material.

13. Method according to claim 12, wherein the polymer material comprises PDMS.

14. Method according to claim 10, wherein each microchip comprises a LED.

15. Method according to claim 14, wherein each microchip further comprises a circuit for controlling the LED arranged against a surface of the LED.

16. Method according to claim 10, wherein each microchip comprises one or a plurality of metal microtubes protruding from a connection surface of the microchip.

17. Method according to claim 10, wherein the liquid of the suspension is a saline solution.

18. Method according to claim 17, wherein the saline solution comprises a sodium polytungstate solution.

* * * * *